(12) United States Patent
Chen et al.

(10) Patent No.: US 9,036,736 B2
(45) Date of Patent: May 19, 2015

(54) METHOD AND APPARATUS FOR CONTROLLING UPDATE OF DIGITAL PRE-DISTORTION COEFFICIENT

(71) Applicant: FUJITSU LIMITED, Kawasaki-shi, Kanagawa (JP)

(72) Inventors: Pei Chen, Beijing (CN); Jianmin Zhou, Beijing (CN); Takanori Iwamatsu, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 13/971,465

(22) Filed: Aug. 20, 2013

(65) Prior Publication Data
US 2014/0050281 A1    Feb. 20, 2014

(30) Foreign Application Priority Data

Aug. 20, 2012  (CN) .......................... 2012 1 0297454

(51) Int. Cl.
| | | |
|---|---|---|
| H04K 1/02 | (2006.01) | |
| H04L 27/36 | (2006.01) | |
| H03F 1/32 | (2006.01) | |
| H03F 3/19 | (2006.01) | |
| H03F 3/24 | (2006.01) | |

(52) U.S. Cl.
CPC ............ *H04L 27/367* (2013.01); *H04L 27/368* (2013.01); *H03F 1/3247* (2013.01); *H03F 1/3258* (2013.01); *H03F 3/19* (2013.01); *H03F 3/245* (2013.01); *H03F 2200/465* (2013.01); *H03F 2201/3233* (2013.01)

(58) Field of Classification Search
CPC ............. H04B 1/00; H04B 3/00; H04B 7/00; H04B 14/00; H04B 17/00; H04B 2001/00; H04B 2201/00; H04J 13/00; H04J 2013/00; H03K 7/00; H03K 9/00; H03L 7/00; H03M 5/00; H04L 1/00; H04L 5/00; H04L 7/00; H04L 25/00; H04L 27/00; H04L 2001/00; H04L 2007/00; H04L 2025/00; H04L 2027/00
See application file for complete search history.

(56) References Cited

U.S. PATENT DOCUMENTS 8,023,588 B1 *   9/2011   Benson et al. ................. 375/297

* cited by examiner

*Primary Examiner* — Adolf Dsouza
(74) *Attorney, Agent, or Firm* — Arent Fox LLP

(57) ABSTRACT

A method and apparatus for controlling update of digital pre-distortion (DPD) coefficient is provided. The apparatus is applicable to a digital power control system, wherein the apparatus comprises: an update controlling unit configured to determine a group of fully-trained DPD coefficients among a plurality of DPD coefficients; and a DPD coefficient generating unit configured to update adaptively the group of fully-trained DPD coefficients according to the result of judgment of the update controlling unit. The DPD coefficients are allowed to be updated after being judged as being able to be fully trained according to power distribution information of DPD input signals, or according to address distribution information of an LUT, or according to average power of output of an HPA; otherwise, they may not be updated, thereby efficiently preventing DPD abnormality resulted from unfull training of coefficients in being updated.

9 Claims, 6 Drawing Sheets

METHOD AND APPARATUS FOR CONTROLLING UPDATE OF DIGITAL PRE-DISTORTION COEFFICIENT

CROSS-REFERENCE TO RELATED APPLICATIONS

This application is based upon and claims the benefit of priority of Chinese Patent Application No. 201210297454.0, filed Aug. 20, 2012, the disclosure of the prior application of which is hereby incorporated in its entirety by reference.

TECHNICAL FIELD

The present invention relates to the field of digital pre-distortion, and in particular to a method and apparatus for controlling update of digital pre-distortion (DPD) coefficient.

BACKGROUND ART

As the development of communication technologies, especially the fast development of wideband communication technologies, various modulation methods of high spectral efficiency are widely used. However, the issue of high peak-to-average power ratio (PAPR) lays higher requirements on the linearization technology of a high-power amplifier (HPA).

In the linearization technology of an HPA, a digital pre-distortion technology is a method that is widely used and efficient. Its basic principle is to perform pre-distortion processing on transmitted signals by a pre-distorter with nonlinear characteristics contrary to those of an HPA before the signals passing through the HPA, so as to improve the nonlinear characteristics of the whole transmitter system and make the whole system to exhibit linear characteristics as possible.

The structure of a pre-distortion transmitter having a digital power control system is as shown in FIG. 1. The digital power control system controls the output power of the HPA via digital gains, changes of the digital gains have effect on power distribution of DPD input signals, and further on address distribution of a look-up table (LUT). This will result in some DPD coefficients under-trained or unfully trained under some power levels, making DPD properties deteriorated, and affecting DPD stability and resulting in abnormality of the operation of the whole transmitter in severe cases.

It should be noted that the above description of the background art is merely provided for clear and complete explanation of the present invention and for easy understanding by those skilled in the art. And it should not be understood that the above technical solution is known to those skilled in the art as it is described in the background art of the present invention.

SUMMARY OF THE INVENTION

An object of the embodiments of the present invention is to provide a method and apparatus for controlling update of DPD coefficient, so as to efficiently prevent DPD abnormality resulted from unfull training of coefficients in being updated.

Another object of the embodiments of the present invention is to provide a method and apparatus for controlling update of DPD coefficient, so as to simplify DPD policies in case of occurrence of fast TPC.

According to an aspect of the embodiments of the present invention, there is provided an apparatus for controlling update of DPD coefficient, comprising:

an update controlling unit configured to determine a group of fully-trained DPD coefficients among a plurality of DPD coefficients; and a DPD coefficient generating unit configured to update adaptively the group of fully-trained DPD coefficients according to the result of judgment of the update controlling unit.

According to another aspect of the embodiments of the present invention, there is provided a transmitter, comprising the apparatus for controlling update of DPD coefficient as described above.

According to still another aspect of the embodiments of the present invention, there is provided a method for controlling update of DPD coefficient, applicable to a digital power control system, the method comprising:

determining a group of fully-trained DPD coefficients among a plurality of DPD coefficients; and updating adaptively the group of fully-trained DPD coefficients.

The advantages of the embodiments of the present invention exist in: with the method and apparatus of the embodiments of the present invention, current fully-trained coefficients are allowed to be updated only they are judged as being able to be fully trained according to power distribution information of DPD input signals, or according to address distribution information of an LUT, or according to average outputted power of an HPA; otherwise, they are not allowed to be updated, thereby efficiently preventing DPD abnormality resulted from unfull training of coefficients in being updated. In another embodiment, the method and apparatus of the embodiments of the present invention simplify DPD policies in case of occurrence of fast TPC.

With reference to the following description and drawings, the particular embodiments of the present invention are disclosed in detail, and the principle of the present invention and the manners of use are indicated. It should be understood that the scope of the embodiments of the present invention is not limited thereto. The embodiments of the present invention contain many alternations, modifications and equivalents within the spirits and scope of the terms of the appended claims.

Features that are described and/or illustrated with respect to one embodiment may be used in the same way or in a similar way in one or more other embodiments and/or in combination with or instead of the features of the other embodiments.

It should be emphasized that the term "comprises/comprising" when used in this specification is taken to specify the presence of stated features, integers, steps or components but does not preclude the presence or addition of one or more other features, integers, steps, components or groups thereof.

BRIEF DESCRIPTION OF THE DRAWINGS

Many aspects of the present invention can be better understood with reference to the following drawings. The components in the drawings are not necessarily to scale, emphasis instead being placed upon clearly illustrating the principles of the present invention. To facilitate illustrating and describing some parts of the invention, corresponding portions of the drawings may be enlarged or reduced.

Elements and features depicted in one drawing or embodiment of the invention may be combined with elements and features depicted in one or more additional drawings or embodiments. Moreover, in the drawings, like reference numerals designate corresponding parts throughout the sev- In the drawings.

DETAILED DESCRIPTION OF THE INVENTION

The foregoing and other features of the embodiments of the present invention will become apparent with reference to the drawings and the following description. These embodiments are exemplary only, and are not intended to limit the present invention. For easy understanding of the principle and embodiments of the present invention by those skilled in the art, the embodiments of the present invention shall be described taking a DPD transmitter having a digital power control unit as an example. However, it should be understood that the embodiments of the present invention are not limited to a transmitter, and are applicable to other systems concerning digital power control.

Embodiment 1

Figure 2:
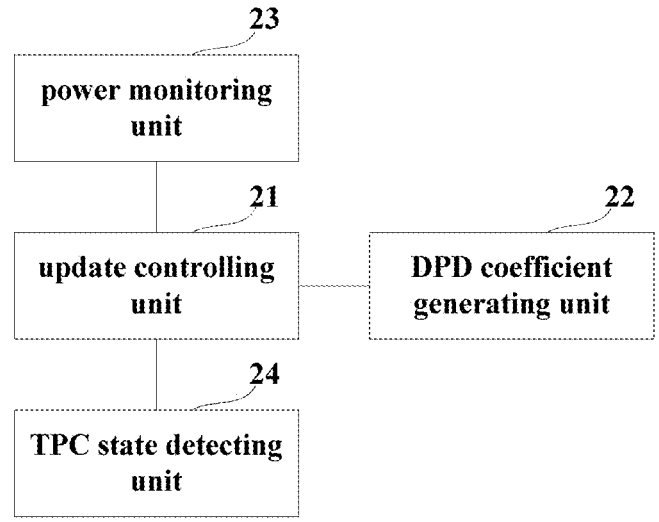
FIG. 2 is a schematic diagram of the composition of the apparatus for controlling update of DPD coefficient of an embodiment of the present invention.

An embodiment of the present invention provides an apparatus for controlling update of DPD coefficient. FIG. 2 is a schematic diagram of the composition of the apparatus, which is applicable to a digital power control system. Referring to FIG. 2, the apparatus comprises:

an update controlling unit 21 configured to determine a group of fully-trained DPD coefficients among a plurality of DPD coefficients; and a DPD coefficient generating unit 22 configured to update adaptively the group of fully-trained DPD coefficients according to the result of judgment of the update controlling unit 21.

in this embodiment, the update controlling unit 21 may determine the group of fully-trained DPD coefficients according to power distribution information of DPD input signals, or according to address distribution information of an LUT, or according to average output power of an HPA, which shall be respectively described below with reference to the drawings.

Figure 3:
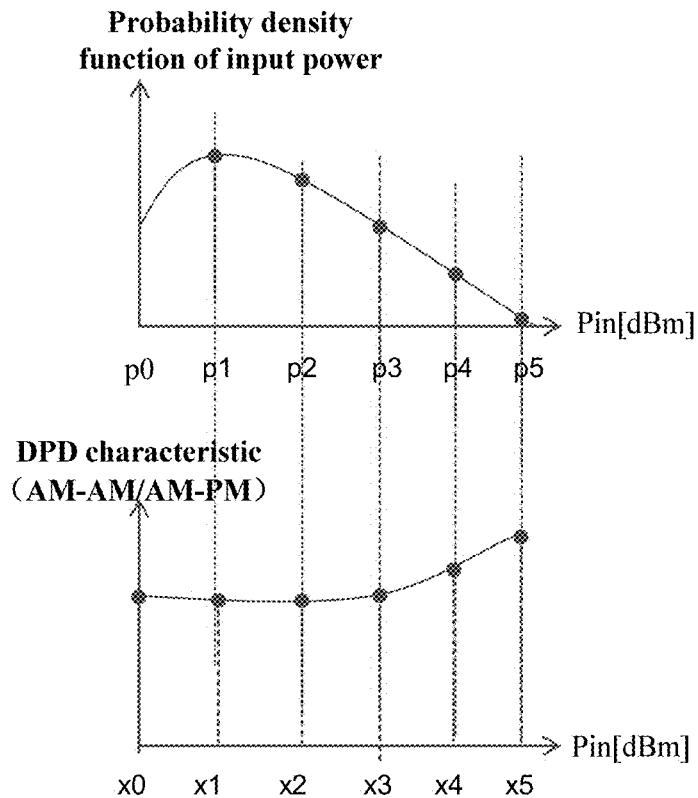
FIG. 3 is a schematic diagram of the principle of a group of fully-trained DPD coefficients determined according to power distribution information of DPD input signals.

FIG. 3 is a schematic diagram of the principle of the update controlling unit 21 in determining the group of fully-trained DPD coefficients according to power distribution information of DPD input signals. Referring to FIG. 3, each of the DPD coefficients (such as x0-x5) corresponds to a specific power level (such as p0-p5), and for each specific power level, if the probability that instantaneous power of the DPD input signals is greater than the specific power level is greater than a predetermined threshold value, referred to as a first threshold value in this embodiment, the update controlling unit 21 may determine that the DPD coefficients to which the power level corresponds can be fully trained and hence be allowed to be updated; otherwise, they are not allowed to be updated. As each specific power level is subjected to the above determination, whether the DPD coefficients to which each specific power level corresponds are allowed to be updated may be determined; therefore, the update controlling unit 21 may determine a group of DPD coefficients allowed to be updated according to power distribution information of DPD input signals. The DPD coefficients allowed to be updated may be updated adaptively by the DPD coefficient generating unit 22.

Wherein, the method of determination of the update controlling unit 21 is just an example of determining DPD coefficients allowed to be updated according to power distribution information of DPD input signals; however, this embodiment is not limited thereto. For example, instantaneous power of DPD input signals may be directly compared with each specific power level, and if the instantaneous power of DPD input signals is greater than a certain specific power level, it may be determined that the DPD coefficients to which the specific power level corresponds are allowed to be updated.

Figure 4:
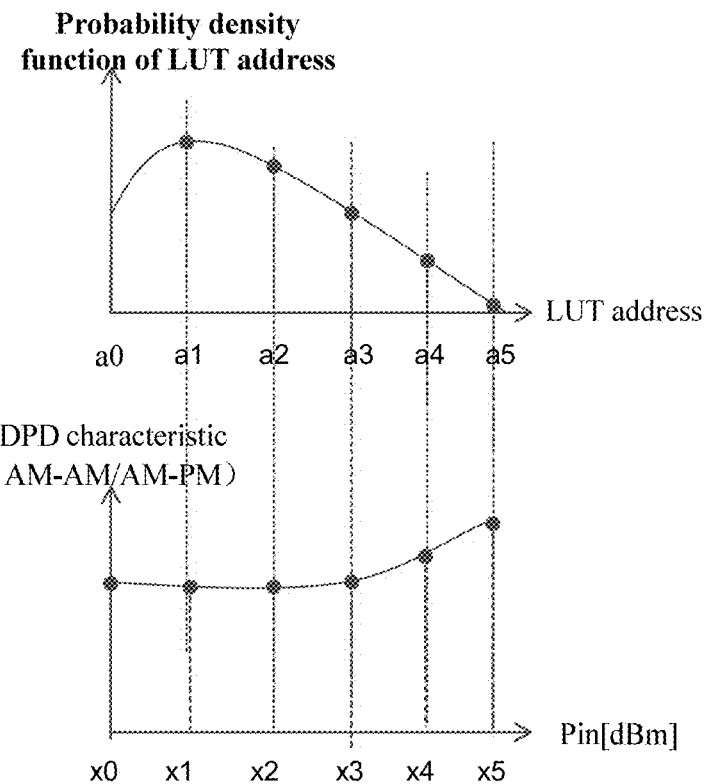
FIG. 4 is a schematic diagram of the principle of a group of fully-trained DPD coefficients determined according to address distribution information of an LUT.

FIG. 4 is a schematic diagram of the principle of the update controlling unit 21 in determining the group of fully-trained DPD coefficients according to address distribution information of an LUT. Referring to FIG. 4, each of the DPD coefficients (such as x0-x5) corresponds to a specific LUT address (such as a0-a5), and for each specific LUT address, if the probability that an LUT address of the DPD input signals is greater than the specific LUT address is greater than a predetermined threshold value, referred to as a second threshold value in this embodiment, the update controlling unit 21 may determine that the DPD coefficients to which the LUT address corresponds can be fully trained and hence be allowed to be updated; otherwise, they are not allowed to be updated. Likewise, as each specific LUT address is subjected to the above determination, whether the DPD coefficients to which each specific LUT address corresponds are allowed to be updated may be determined; therefore, a group of DPD coefficients allowed to be updated may be determined according to the address distribution of the LUT. The DPD coefficients allowed to be updated may be updated adaptively by the DPD coefficient generating unit 22.

Wherein, the method of determination of the update controlling unit 21 is just an example of determining DPD coefficients allowed to be updated according to LUT address distribution information; however, this embodiment is not limited thereto. For example, the LUT address of DPD input signals may be directly compared with each specific LUT address, and if the LUT address of DPD input signals is greater than a certain specific LUT address, it may be determined that the DPD coefficients to which the specific LUT address corresponds are allowed to be updated.

Figure 5:
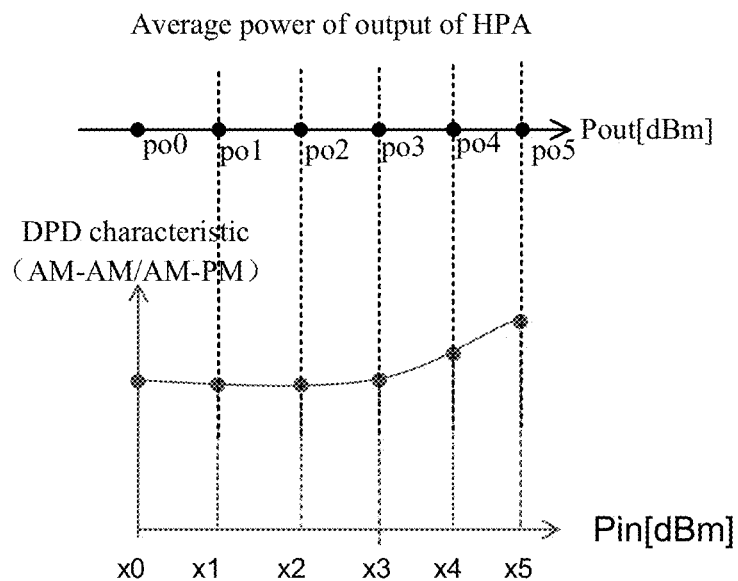
FIG. 5 is a schematic diagram of the principle of a group of fully-trained DPD coefficients determined according to average output power of an HPA.

FIG. 5 is a schematic diagram of the principle of update controlling unit 21 in determining a group of fully-trained DPD coefficients according to average output power of an HPA. Referring to FIG. 5, each of the DPD coefficients (such as x0-x5) corresponds to a specific level of average output power of the HPA (such as p00-p05), and for each specific level of average output power of the HPA, if the current average output power of the HPA is greater than the specific level of average output power of the HPA, the update controlling unit 21 may determine that the DPD coefficients to which the specific level of average output power of the HPA corresponds can be fully trained and hence be allowed to be updated; otherwise, they are not allowed to be updated. As each specific level of average output power of the HPA is subjected to the above determination, whether the DPD coefficients to which each specific level of average output power of an HPA corresponds are allowed to be updated may be determined; therefore, a group of DPD coefficients allowed to be updated may be determined according to the specific level of average output power of the HPA. The DPD coefficients allowed to be updated may be updated adaptively by the DPD coefficient generating unit 22.

In an embodiment, the apparatus for controlling update of DPD coefficient may further comprises:

a power monitoring unit 23 configured to monitor current average output power of HPA. And when the power monitoring unit 23 monitors that the current average output power of the HPA is at high power, i.e. the current average output power of the HPA is greater than a predetermined threshold value, referred to as a third threshold value in this embodiment, the update controlling unit 21 writes the DPD coefficients obtained by the DPD coefficient generating unit 22 through the adaptive update into a memory, so as to update the DPD coefficients stored in the memory; or in an embodiment where no DPD coefficient is saved in a memory, writes the DPD coefficients into the memory by the write unit 23 of this embodiment. Wherein, the memory may be an internal memory, such a flash memory of the transmitter, and may also be an external memory. However, this embodiment is not limited thereto.

In an embodiment, the apparatus for controlling update of DPD coefficient may further comprises:

a transmission power control (TPC) state detecting unit 24 configured to detect a current TPC state; and when the TPC state detecting unit 24 detects that fast TPC occurs, the update controlling unit 21 controls the DPD coefficient generating unit 22 to stop the updating of the DPD coefficients, and controls the DPD coefficient generating unit 22 to use current DPD coefficients or DPD coefficients read from a memory as the DPD coefficients.

Figure 6:
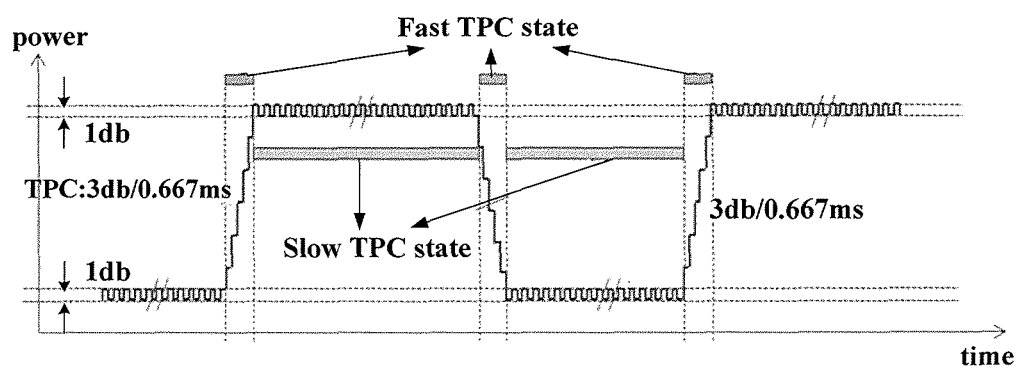
FIG. 6 is a schematic diagram of a TPC state during the operation of a transmitter.

Wherein, detecting the current TPC state may be achieved by a TPC state detector of the transmitter, and FIG. 6 shows a schematic diagram of a TPC state during the operation of the transmitter. The TPC state detector may detect whether the current TPC state is a fast TPC state or a slow TPC state. In the fast TPC state, transmission power of signals changes quickly, and the DPD is unable to follow such changes; hence, update of the DPD coefficients is stopped by the processing unit 24 of this embodiment, and the currently-updated coefficients or the coefficients read from the memory are directly used as the DPD coefficients for pre-distortion processing. In the slow TPC state, transmission power of signals changes slowly, and the DPD coefficients may be updated by the update controlling unit 21 and the DPD coefficient generating unit 22 of this embodiment.

For clarity and easy understanding of the apparatus for controlling update of DPD coefficient of this embodiment, the apparatus for controlling update of DPD coefficient of this embodiment shall be described below in conjunction with a DPD transmitter containing such an apparatus.

Figure 7:
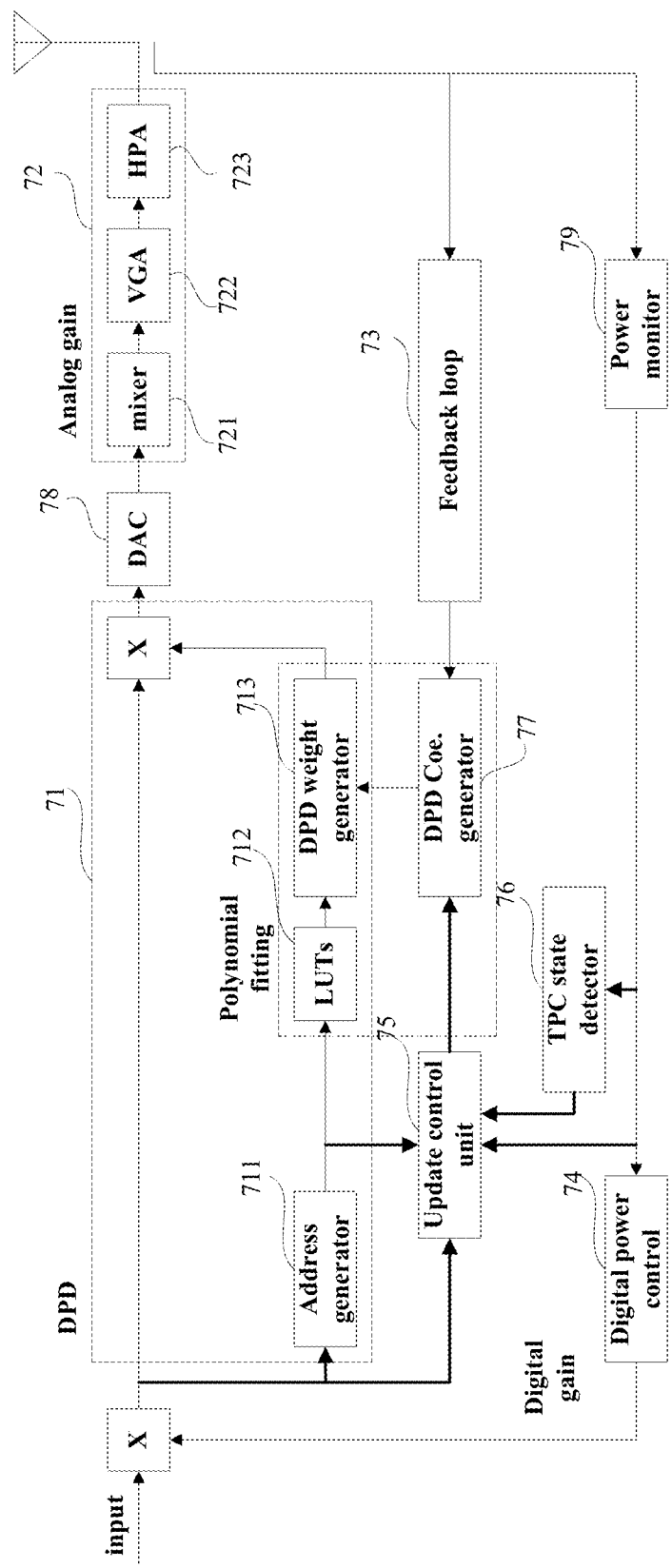
FIG. 7 is a schematic diagram of the composition of a DPD transmitter having a digital power control unit.

FIG. 7 is a schematic diagram of the composition of a DPD transmitter having a digital power control unit. Referring to FIG. 7, the transmitter comprises:

a digital pre-distorter (DPD) 71 configured to perform digital pre-distortion processing and comprising an address generator 711, an LUT 712 and a DPD weight generator 713;

an analog part 72 of a transmission branch comprising a mixer 721, a variable gain amplifier (VGA) 722 and a high power amplifier (HPA) 723;

a DPD feedback loop 73 configured to acquire cost functions for DPD update, so as to adaptively generate DPD coefficients;

a digital power control part 74 configured to acquire digital gains;

an update control unit 75 configured to control update of the DPD coefficients;

a TPC state detector 76 configured to detect the current TPC state of the transmitter, so as to determine whether fast TPC occurs;

a DPD coefficient generator 77 configured to update adaptively the DPD coefficients according to the control of the update control unit 75;

a digital to analog converter (DAC) 78 configured to perform digital to analog conversion; and a power monitor 79 configured to detect the current output power of the HPA.

Figure 1:
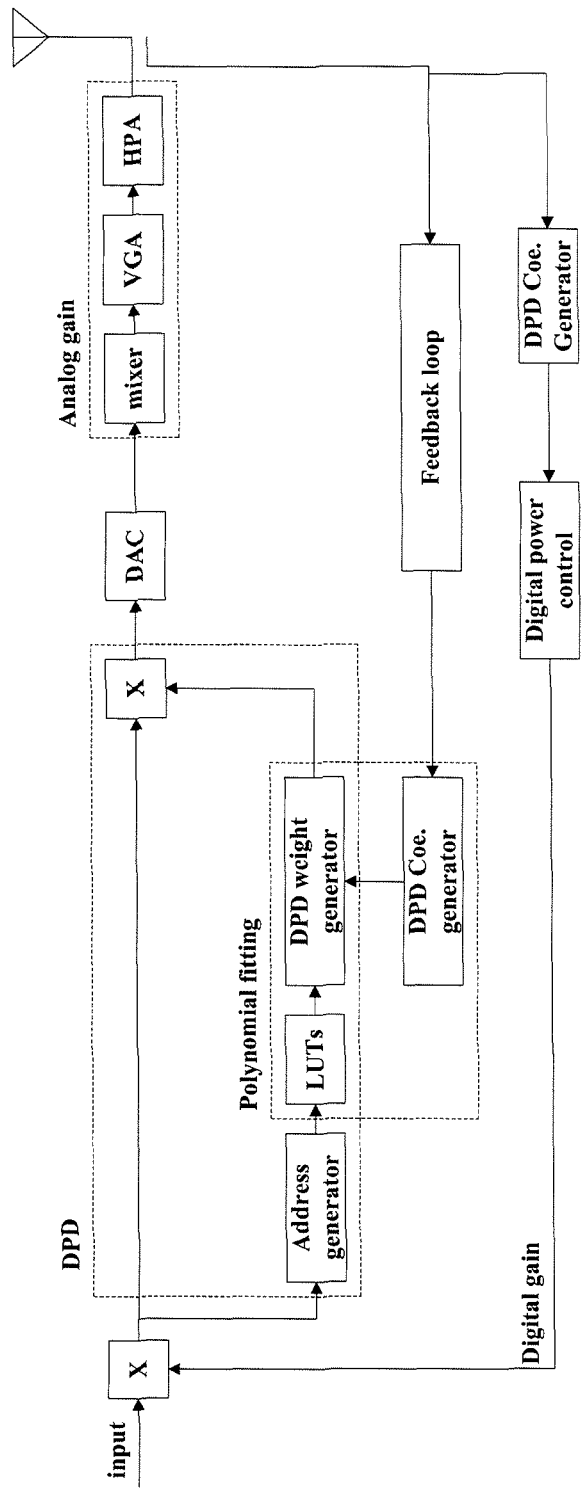
FIG. 1 is a schematic diagram of the structure of an existing pre-distortion transmitter having a digital power control unit.

Wherein, the DPD 71, the analog part 72, the feedback loop 73, the digital power control part 74 and the DAC 78 may be realized by the composition of an existing transmitter, such as the composition of the transmitter shown in FIG. 1, and the functions of them are incorporated herein, which shall not be described herein any further.

Wherein, the update control unit 75 may be realized by the update controlling unit 21 of this embodiment, as described above, and judges which DPD coefficients can be fully trained and which DPD coefficients cannot be fully trained according to power distribution information of DPD input signals, or according to address distribution information of an LUT, or according to average output power of an HPA, with the DPD coefficients that can be fully trained being allowed to be updated, and the DPD coefficients that cannot be fully trained being not allowed to be updated.

Wherein, the DPD coefficient generator 77 may be realized by the DPD coefficient generating unit 22 of this embodiment, as described above, and adaptively updates the DPD coefficients that are allowed to be updated according to the result of judgment of the update control unit 75.

Wherein, the TPC state detector 76 may be realized by the TPC state detecting unit 24 of this embodiment, as described above, and is configured to detect the current TPC state; and if it is in the fast TPC state, the update of the DPD coefficients is stopped by the DPD coefficient generator 77 under the control of the update control unit 75, and the DPD uses the current coefficients or the coefficients read from the memory for pre-distortion processing; otherwise, the DPD coefficient generator 77 adaptively updates the DPD coefficients according to the result of judgment of the update control unit 75.

Wherein, the power monitor 79 may be realized by the power monitoring unit 23 of this embodiment, as described above, and is configured to detect the current average output power of the HPA.

With the embodiment of the present invention, the DPD coefficients are allowed to be updated after being judged as being able to be fully trained according to power distribution information of DPD input signals, or according to address distribution information of an LUT, or according to average output power of an HPA; otherwise, they are not allowed to be updated, thereby efficiently preventing DPD abnormality resulted from unfull training of coefficients in being updated. In another embodiment, the apparatus of the embodiment of the present invention simplifies DPD policies in case of occurrence of fast TPC.

Embodiment 2

An embodiment of the present invention provides a transmitter, which is a pre-distortion transmitter having digital power control. FIG. 7 is a schematic diagram of the composition of the transmitter. As shown in FIG. 7, besides the existing composition and functions, the transmitter further comprises the apparatus for controlling update of DPD coefficient as described in Embodiment 1, for controlling the update the DPD coefficients of the transmitter of this embodiment. As the apparatus for controlling update of DPD coefficient is described in detail in Embodiment 1, the contents are incorporated herein, which shall not be described herein any further.

The transmitter of this embodiment employs the apparatus for controlling update of DPD coefficient of Embodiment 1, which efficiently prevents DPD abnormality resulted from unfull training of coefficients in being updated on the one hand, and on the other hand, simplifies DPD policies in case of occurrence of fast TPC.

Embodiment 3

An embodiment of the present invention provides a method for controlling update of DPD coefficient, applicable to a digital power control system. As the principle of the method in solving problems is similar to that of the apparatus for controlling update of DPD coefficient of Embodiment 1, the implementation of the apparatus for controlling update of DPD coefficient of Embodiment 1 may be referred to for the implementation of this method, and the repeated parts shall not be described any further.

Figure 8:
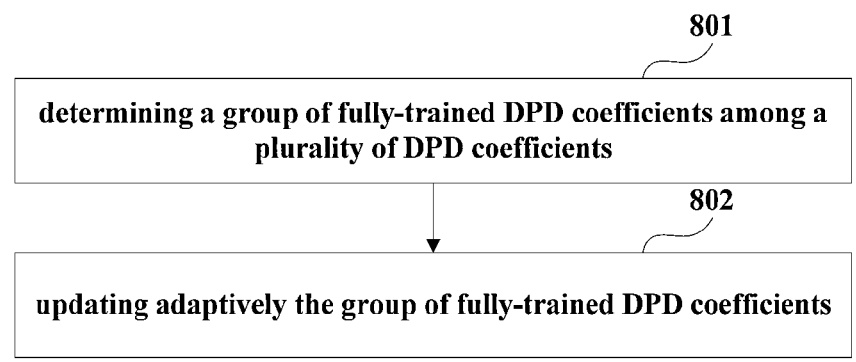
FIG. 8 is a flowchart of the method for controlling update of DPD coefficient of an embodiment of the present invention.

FIG. 8 is a flowchart of the method. Referring to FIG. 8, the method comprises:

step 801: determining a group of fully-trained DPD coefficients among a plurality of DPD coefficients; and step 802: updating adaptively the group of fully-trained DPD coefficients.

In step 801, the group of fully-trained DPD coefficients may be determined according to power distribution information of a DPD input signal, or according to address distribution information of an LUT, or according to average output power of an HPA.

Wherein, if the group of fully-trained DPD coefficients are determined according to power distribution information of a DPD input signal, each of the DPD coefficients corresponds to a specific power level, and for each specific power level, if a probability that instantaneous power of the DPD input signal is greater than the specific power level is greater than a first threshold value, it is determined that the DPD coefficient to which the specific power level corresponds is fully trained.

Wherein, if the group of fully-trained DPD coefficients are determined according to address distribution information of an LUT, each of the DPD coefficients corresponds to a specific LUT address, and for each specific LUT address, if a probability that a lookup table address of the DPD input signal is greater than the specific LUT address is greater than a second threshold value, it is determined that the DPD coefficient to which the specific LUT address corresponds is fully trained.

Wherein, if the group of fully-trained DPD coefficients are determined according to average output power of an HPA, each of the DPD coefficients corresponds to a specific level of average output power of an HPA, and for each specific level of average output power of an HPA, if a current average output power of an HPA is greater than the specific level of average output power of the HPA, it is determined that the DPD coefficient to which the specific level of average output power of the HPA corresponds is fully trained.

In an embodiment, if the current average output power of the HPA is greater than a third threshold value, the DPD coefficients obtained through the adaptive update are written into a memory.

In an embodiment, if fast TPC occurs, the updating of the DPD coefficients is stopped, and current DPD coefficients or DPD coefficients read from a memory are used as the DPD coefficients.

With the method of the embodiment of the present invention, DPD abnormality resulted from unfull training of coefficients in being updated is efficiently prevented on the one hand; and on the other hand, DPD policies in case of occurrence of fast TPC are simplified.

The above apparatuses and methods of the present invention may be implemented by hardware, or by hardware in combination with software. The present invention relates to such a computer-readable program that when the program is executed by a logic device, the logic device is enabled to carry out the apparatus or components as described above, or to carry out the methods or steps as described above. The logic is such as field programmable gate array (FPGA), Microprocessor, processor in computer, etc. The present invention also relates to a storage medium for storing the above program, such as a hard disk, a floppy disk, a CD, a DVD, and a flash memory, etc.

The present invention is described above with reference to particular embodiments. However, it should be understood by those skilled in the art that such a description is illustrative only, and not intended to limit the protection scope of the present invention. Various variants and modifications may be made by those skilled in the art according to the spirits and principle of the present invention, and such variants and modifications fall within the scope of the present invention.

For the implementation of the present invention containing the above embodiments, following supplements are further disclosed.

Supplement 1. A method for controlling update of digital pre-distortion (DPD) coefficient, applicable to a digital power control system, the method comprising:

determining a group of fully-trained DPD coefficients among a plurality of DPD coefficients; and updating adaptively the group of fully-trained DPD coefficients.

Supplement 2. The method according to supplement 1, wherein the determining a group of fully-trained DPD coefficients among a plurality of DPD coefficients comprises:

determining a group of fully-trained DPD coefficients according to power distribution information of a DPD input signal; or determining a group of fully-trained DPD coefficients according to address distribution information of an LUT; or determining a group of fully-trained DPD coefficients according to average power of output of an HPA.

Supplement 3. The method according to supplement 2, wherein each of the DPD coefficients corresponds to a specific power level, and determining a group of fully-trained DPD coefficients according to power distribution information of a DPD input signal comprises:

for each specific power level, if a probability that instantaneous power of the DPD input signal is greater than the specific power level is greater than a first threshold value, determining that the DPD coefficient to which the specific power level corresponds is fully trained.

Supplement 4. The method according to supplement 2, wherein each of the DPD coefficients corresponds to a specific LUT address, and determining a group of fully-trained DPD coefficients according to address distribution information of an LUT comprises:

for each specific LUT address, if a probability that a lookup table address of the DPD input signal is greater than the specific LUT address is greater than a second threshold value, determining that the DPD coefficient to which the specific LUT address corresponds is fully trained.

Supplement 5. The method according to supplement 2, wherein each of the DPD coefficients corresponds to a specific average power level of output of an HPA, and determining a group of fully-trained DPD coefficients according to average power of output of an HPA comprises:

for each specific average power level of output of an HPA, if a current average power of output of an HPA is greater than the specific average power level of the output of the HPA, determining that the DPD coefficient to which the specific average power level of the output of the HPA corresponds is fully trained.

Supplement 6. The method according to supplement 1, wherein the method further comprises:

if the current average power of the output of the HPA is greater than a third threshold value, the DPD coefficients obtained through the adaptive update are written into a memory.

Supplement 7. The method according to supplement 1, wherein the method further comprises:

if fast TPC occurs, the updating of the DPD coefficients is stopped, and current DPD coefficients or DPD coefficients read from a memory are used as the DPD coefficients.

Supplement 8. An apparatus for controlling update of digital pre-distortion (DPD) coefficient, applicable to a digital power control system, the apparatus comprising:

an update controlling unit configured to determine a group of fully-trained DPD coefficients among a plurality of DPD coefficients; and a DPD coefficient generating unit configured to update adaptively the group of fully-trained DPD coefficients according to the result of judgment of the update controlling unit.

Supplement 9. The apparatus according to supplement 8, wherein the update controlling unit determines the group of fully-trained DPD coefficients according to power distribution information of a DPD input signal, or determines the group of fully-trained DPD coefficients according to address distribution information of a lookup table, or determines the group of fully-trained DPD coefficients according to average power of output of an HPA.

Supplement 10. The apparatus according to supplement 9, wherein each of the DPD coefficients corresponds to a specific power level, and for each specific power level, if a probability that instantaneous power of the DPD input signal is greater than the specific power level is greater than a first threshold value, the update controlling unit determines that the DPD coefficient to which the specific power level corresponds is fully trained.

Supplement 11. The apparatus according to supplement 9, wherein each of the DPD coefficients corresponds to a specific lookup table address, and for each specific lookup table address, if a probability that a lookup table address of the DPD input signal is greater than the specific lookup table address is greater than a second threshold value, the update controlling unit determines that the DPD coefficient to which the specific lookup table address corresponds is fully trained.

Supplement 12. The apparatus according to supplement 9, wherein each of the DPD coefficients corresponds to a specific average power level of output of an HPA, and for each specific average power level of output of an HPA, if a current average power of output of an HPA is greater than the specific average power level of the output of the HPA, the update controlling unit determines that the DPD coefficient to which the specific average power level of the output of the HPA corresponds is fully trained.

Supplement 13. The apparatus according to supplement 8, wherein the apparatus further comprises:

a power monitoring unit configured to monitor current average power of output of a HPA;

and when the power monitoring unit monitors that the current average power of the output of the HPA is greater than a third threshold value, the update controlling unit controls the DPD coefficient generating unit to write the DPD coefficients obtained through the adaptive update into a memory.

Supplement 14. The apparatus according to supplement 8, wherein the apparatus further comprises:

a TPC state detecting unit configured to detect a current TPC state;

and when the TPC state detecting unit detects that fast transmission power control (TPC) occurs, the update controlling unit controls the DPD coefficient generating unit to stop the updating of the DPD coefficients, and controls the DPD coefficient generating unit to use current DPD coefficients or DPD coefficients read from a memory as the DPD coefficients.

Supplement 15. A transmitter, comprising the apparatus for controlling update of DPD coefficient as described in any one of supplements 8-14.

The invention claimed is:

1. An apparatus for controlling an update of at least one digital pre-distortion (DPD) coefficient, applicable to a digital power control system, the apparatus comprising:
   an update controlling unit configured to perform a judgment to determine a group of fully-trained DPD coefficients among a plurality of DPD coefficients; and
   a DPD coefficient generating unit configured to adaptively update the group of fully-trained DPD coefficients according to a result of the judgment performed by the update controlling unit;
   wherein the update controlling unit determines the group of fully-trained DPD coefficients according to power distribution information of a DPD input signal;
   wherein each of the plurality of DPD coefficients corresponds to a specific power level, and for each specific power level, if a probability that instantaneous power of the DPD input signal is greater than the specific power level is greater than a first threshold value, the update controlling unit determines that the DPD coefficient to which the specific power level corresponds is fully trained.

2. An apparatus for controlling an update of at least one digital pre-distortion (DPD) coefficient, applicable to a digital power control system, the apparatus comprising:
   an update controlling unit configured to perform a judgment to determine a group of fully-trained DPD coefficients among a plurality of DPD coefficients; and
   a DPD coefficient generating unit configured to adaptively update the group of fully-trained DPD coefficients according to a result of the judgment performed by the update controlling unit;
   wherein the update controlling unit determines the group of fully-trained DPD coefficients according to address distribution information of a lookup table;
   wherein each of the plurality of DPD coefficients corresponds to a specific lookup table address, and for each specific lookup table address, if a probability that a lookup table address of the DPD input signal is greater than the specific lookup table address is greater than a second threshold value, the update controlling unit determines that the DPD coefficient to which the specific lookup table address corresponds is fully trained.

3. An apparatus for controlling an update of at least one digital pre-distortion (DPD) coefficient, applicable to a digital power control system, the apparatus comprising:
an update controlling unit configured to perform a judgment to determine a group of fully-trained DPD coefficients among a plurality of DPD coefficients; and
a DPD coefficient generating unit configured to adaptively update the group of fully-trained DPD coefficients according to a result of the judgment performed by the update controlling unit;
wherein the update controlling unit determines the group of fully-trained DPD coefficients according to average power of an output of a high-power amplifier (HPA)
wherein each of the plurality of DPD coefficients corresponds to a specific average power level of the output of the HPA, and for each specific average power level of the output of the HPA, if a current average power of output of an HPA is greater than the specific average power level of the output of the HPA, the update controlling unit determines that the DPD coefficient to which the specific average power level of the output of the HPA corresponds is fully trained.

4. An apparatus for controlling an update of at least one digital pre-distortion (DPD) coefficient, applicable to a digital power control system, the apparatus comprising:
an update controlling unit configured to perform a judgment to determine a group of fully-trained DPD coefficients among a plurality of DPD coefficients; and
a DPD coefficient generating unit configured to adaptively update the group of fully-trained DPD coefficients according to a result of the judgment performed by the update controlling unit;
wherein the apparatus further comprises:
a transmission power control (TPC) state detecting unit configured to detect a current TPC state;
and wherein when the TPC state detecting unit detects that fast transmission power control (TPC) occurs, the update controlling unit controls the DPD coefficient generating unit to stop updating DPD coefficients, and controls the DPD coefficient generating unit to use current DPD coefficients or stored DPD coefficients read from a memory as updated DPD coefficients.

5. A transmitter, comprising an apparatus for controlling an update of at least one digital pre-distortion (DPD) coefficient, applicable to a digital power control system, the apparatus comprising:
an update controlling unit configured to perform a judgment to determine a group of fully-trained DPD coefficients among a plurality of DPD coefficients; and
a DPD coefficient generating unit configured to adaptively update the group of fully-trained DPD coefficients according to a result of the judgment performed by the update controlling unit;
wherein the update controlling unit determines the group of fully-trained DPD coefficients according to at least one of power distribution information of a DPD input signal;
wherein each of the plurality of DPD coefficients corresponds to a specific power level, and for each specific power level, if a probability that instantaneous power of the DPD input signal is greater than the specific power level is greater than a first threshold value, the update controlling unit determines that the DPD coefficient to which the specific power level corresponds is fully trained.

6. A method for controlling an update of at least one digital pre-distortion (DPD) coefficient, applicable to a digital power control system, the method comprising:
performing a judgment to determine a group of fully-trained DPD coefficients among a plurality of DPD coefficients; and
adaptively updating the group of fully-trained DPD coefficients according to a result of the judgment;
wherein performing the judgment further comprises at least one of:
determining the group of fully-trained DPD coefficients according to power distribution information of a DPD input signal, wherein each of the plurality of DPD coefficients corresponds to a specific power level, and for each specific power level, if a probability that an instantaneous power of a DPD input signal is greater than the specific power level is greater than a first threshold value, it is determined that the DPD coefficient to which the specific power level corresponds is fully trained; or
determining the group of fully-trained DPD coefficients according to address distribution information of a lookup table, wherein each of the plurality of DPD coefficients corresponds to a specific lookup table address, and for each specific lookup table address, if a probability that a lookup table address of the DPD input signal is greater than the specific lookup table address is greater than a second threshold value, it is determined that the DPD coefficient to which the specific lookup table address corresponds is fully trained; or
determining the group of fully-trained DPD coefficients according to average power of output of a high-power amplifier (HPA), wherein each of the plurality of DPD coefficients corresponds to a specific average power level of the output of the HPA, and for each specific average power level of the output of the HPA, if a current average power of output of an HPA is greater than the specific average power level of the output of the HPA, it is determined that the DPD coefficient to which the specific average power level of the output of the HPA corresponds is fully trained.

7. A transmitter, comprising an apparatus for controlling an update of at least one digital pre-distortion (DPD) coefficient, applicable to a digital power control system, the apparatus comprising:
an update controlling unit configured to perform a judgment to determine a group of fully-trained DPD coefficients among a plurality of DPD coefficients; and
a DPD coefficient generating unit configured to adaptively update the group of fully-trained DPD coefficients according to a result of the judgment performed by the update controlling unit;
wherein the update controlling unit determines the group of fully-trained DPD coefficients according to address distribution information of a lookup table;
wherein each of the plurality of DPD coefficients corresponds to a specific lookup table address, and for each specific lookup table address, if a probability that a lookup table address of the DPD input signal is greater than the specific lookup table address is greater than a second threshold value, the update controlling unit determines that the DPD coefficient to which the specific lookup table address corresponds is fully trained.

8. A transmitter, comprising an apparatus for controlling an update of at least one digital pre-distortion (DPD) coefficient, applicable to a digital power control system, the apparatus comprising:
- an update controlling unit configured to perform a judgment to determine a group of fully-trained DPD coefficients among a plurality of DPD coefficients; and
- a DPD coefficient generating unit configured to adaptively update the group of fully-trained DPD coefficients according to a result of the judgment performed by the update controlling unit;
- wherein the update controlling unit determines the group of fully-trained DPD coefficients according to average power of output of a high-power amplifier (HPA);
- wherein each of the plurality of DPD coefficients corresponds to a specific average power level of an output of the HPA, and for each specific average power level of the output of the HPA, if a current average power of output of an HPA is greater than the specific average power level of the output of the HPA, the update controlling unit determines that the DPD coefficient to which the specific average power level of the output of the HPA corresponds is fully trained.

9. A transmitter, comprising an apparatus for controlling update of digital pre-distortion (DPD) coefficient, applicable to a digital power control system, the apparatus comprising:
- an update controlling unit configured to determine a group of fully-trained DPD coefficients among a plurality of DPD coefficients; and
- a DPD coefficient generating unit configured to adaptively update the group of fully-trained DPD coefficients according to a result of the judgment performed by the update controlling unit;
- wherein the apparatus further comprises:
- a transmission power control (TPC) state detecting unit configured to detect a current TPC state;
- and wherein when the TPC state detecting unit detects that fast transmission power control (TPC) occurs, the update controlling unit controls the DPD coefficient generating unit to stop updating DPD coefficients, and controls the DPD coefficient generating unit to use current DPD coefficients or stored DPD coefficients read from a memory as updated DPD coefficients.

\* \* \* \* \*